US011621306B2

(12) United States Patent
Kim et al.

(10) Patent No.: US 11,621,306 B2
(45) Date of Patent: Apr. 4, 2023

(54) DISPLAY PANEL HAVING IMPROVED TRANSMITTANCE, DISPLAY APPARATUS INCLUDING THE SAME

(71) Applicant: Samsung Display Co., Ltd., Yongin-Si (KR)

(72) Inventors: Jaeik Kim, Seoul (KR); Yeonhwa Lee, Hwaseong-si (KR); Joongu Lee, Seoul (KR); Hye Jin Gwark, Suwon-si (KR); Jungsun Park, Yongin-si (KR); Heemin Park, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/161,734

(22) Filed: Jan. 29, 2021

(65) Prior Publication Data
US 2021/0408167 A1    Dec. 30, 2021

(30) Foreign Application Priority Data

Jun. 24, 2020  (KR) ......................... 10-2020-0077269

(51) Int. Cl.
*H01L 27/32* (2006.01)
*H01L 51/52* (2006.01)

(52) U.S. Cl.
CPC ...... *H01L 27/3223* (2013.01); *H01L 51/5225* (2013.01)

(58) Field of Classification Search
CPC combination set(s) only.
See application file for complete search history.

(56) References Cited

U.S. PATENT DOCUMENTS

| 9,620,732 | B2 | 4/2017 | Malik et al. | |
|---|---|---|---|---|
| 10,074,705 | B2 | 9/2018 | Chung et al. | |
| 2018/0139855 | A1 | 5/2018 | Stay et al. | |
| 2018/0261792 | A1* | 9/2018 | Kwon | H01L 51/5203 |
| 2018/0277612 | A1* | 9/2018 | Kim | H01L 27/3211 |
| 2019/0148663 | A1 | 5/2019 | Lee et al. | |
| 2021/0202612 | A1* | 7/2021 | Jung | H01L 27/3262 |

FOREIGN PATENT DOCUMENTS

| KR | 10-1149427 B1 | 5/2012 |
|---|---|---|
| KR | 10-2017-0129318 A | 11/2017 |
| KR | 10-2018-0022847 A | 3/2018 |
| KR | 10-2019-0055281 A | 5/2019 |

* cited by examiner

*Primary Examiner* — Suberr L Chi
(74) *Attorney, Agent, or Firm* — Innovation Counsel LLP

(57) ABSTRACT

A display apparatus of an embodiment includes a first area and a second area disposed adjacent to the first area in a plan view, and includes a first electrode disposed in the first area and a second electrode disposed in the second area, a hole transport region disposed on the first electrode and the second electrode, an emission layer disposed on the hole transport region to overlap the first electrode and not to overlap the second electrode, a buffer layer disposed on the emission layer in the first area and the second area, a surface energy controlling layer disposed on the buffer layer to overlap the second electrode and not to overlap the first electrode, and a third electrode disposed on the buffer layer to overlap the first electrode and not to overlap the surface energy controlling layer. Such a display apparatus may have improved transmittance.

19 Claims, 12 Drawing Sheets

DISPLAY PANEL HAVING IMPROVED TRANSMITTANCE, DISPLAY APPARATUS INCLUDING THE SAME

CROSS-REFERENCE TO RELATED APPLICATIONS

This U.S. non-provisional patent application claims priority under 35 U.S.C. § 119 to Korean Patent Application No. 10-2020-0077269, filed on Jun. 24, 2020, the entire contents of which are hereby incorporated by reference.

BACKGROUND

The present disclosure herein relates to a display panel and a display apparatus including the same. More particularly, the present disclosure herein relates to a display apparatus having improved transmittance.

A display apparatus is an apparatus displaying images, and recently, an organic light-emitting display apparatus receives attention. The organic light-emitting display apparatus has high-quality properties including low power consumption, high luminance, and fast response time.

The organic light-emitting display apparatus employs a transparent organic light-emitting display panel and may have transparent properties. In a transparent organic light-emitting display panel, a light transmitting area for transmitting light may be defined in each pixel. Accordingly, a user may recognize images displayed through the pixels of a display panel and may recognize objects or images disposed at the rear side of the display panel through light transmitting areas.

SUMMARY

The present disclosure provides a display panel employing a layer of which surface energy is controlled to improve light transmittance and a display apparatus including the same.

The present disclosure also provides a display panel employing a buffer layer for preventing the life reduction of a display apparatus and a display apparatus including the same.

An embodiment of the inventive concept provides a display panel including a first area and a second area disposed adjacent to the first area in a plan view. The display panel includes a first electrode disposed in the first area and a second electrode dispose in the second area, a hole transport region disposed on the first electrode and the second electrode to overlap the first electrode and the second electrode in a plan view, an emission layer disposed on the hole transport region to overlap the first electrode and not to overlap the second electrode in a plan view, a buffer layer disposed on the emission layer in the first area and the second area, a surface energy controlling layer disposed on the buffer layer to overlap the second electrode and not to overlap the first electrode in a plan view, and a third electrode disposed on the buffer layer to overlap the first electrode and not to overlap the surface energy controlling layer in a plan view.

In an embodiment, the second area may have higher light transmittance than the first area.

In an embodiment, the surface energy controlling layer may have lower surface energy than the third electrode.

In an embodiment, the surface energy controlling layer may include a fluorinated organic compound.

In an embodiment, the fluorinated organic compound may include a trifluoromethyl group at a terminal.

In an embodiment, an elemental ratio of fluorine with respect to total elements of the surface energy controlling layer may be about 10% to about 70%.

In an embodiment, a concentration of the fluorine may increase from an inner part to a surface of the surface energy controlling layer.

In an embodiment, the display panel may further include an electron transport layer disposed between the emission layer and the buffer layer.

In an embodiment, the display panel may further include an electron injection layer directly disposed on the buffer layer to overlap the first area and not to overlap the second area in a plan view.

In an embodiment, the display panel may further include an electron injection layer directly disposed beneath the buffer layer to overlap the first area and the second area in a plan view.

In an embodiment, the display panel may further include a fourth electrode disposed on the third electrode.

In an embodiment, the display panel may further include a residual layer disposed on the surface energy controlling layer, and the residual layer may include the same material as the third electrode.

In an embodiment, the first area and the second area may include a plurality of first areas and a plurality of second areas. The plurality of first areas may be disposed to be spaced apart from each other and the plurality of the second areas may be disposed adjacent to the plurality of first areas, respectively.

In an embodiment, the first area and the second area may include a plurality of first areas and a plurality of second areas. A portion of the plurality of first areas may be disposed adjacent to the plurality of second areas, respectively.

In an embodiment of the inventive concept, there is provided a display apparatus including a first area and a second area disposed adjacent to the first area in a plan view, a pixel disposed in the first area, the pixel including an organic light-emitting diode having a first electrode, an emission layer, a buffer layer and a second electrode, and a deficient pixel disposed in the second area, the deficient pixel including a the first electrode, the buffer layer and a surface energy controlling layer, and not including the emission layer and the second electrode.

In an embodiment, the buffer layer may include at least one among Be, Mg, Ca, Sr, Ba, Ra, La, Ce, Pr, Nd, Pm, Sm, Eu, Gd, Tb, Dy, Ho, Er, Tm, Yb, Lu, Li, Al, compounds thereof, mixtures thereof, $CuO_x$, $MoO_x$, $WO_x$, ZnO, $TiO_2$, $SnO_2$, $V_2O_x$, and NiO.

In an embodiment, the display apparatus may further include an encapsulation layer encapsulating the second electrode and the surface energy controlling layer.

In an embodiment, the display apparatus may further include a capping layer disposed on the second electrode and the surface energy controlling layer.

BRIEF DESCRIPTION OF THE FIGURES

The accompanying drawings are included to provide a further understanding of the inventive concept and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
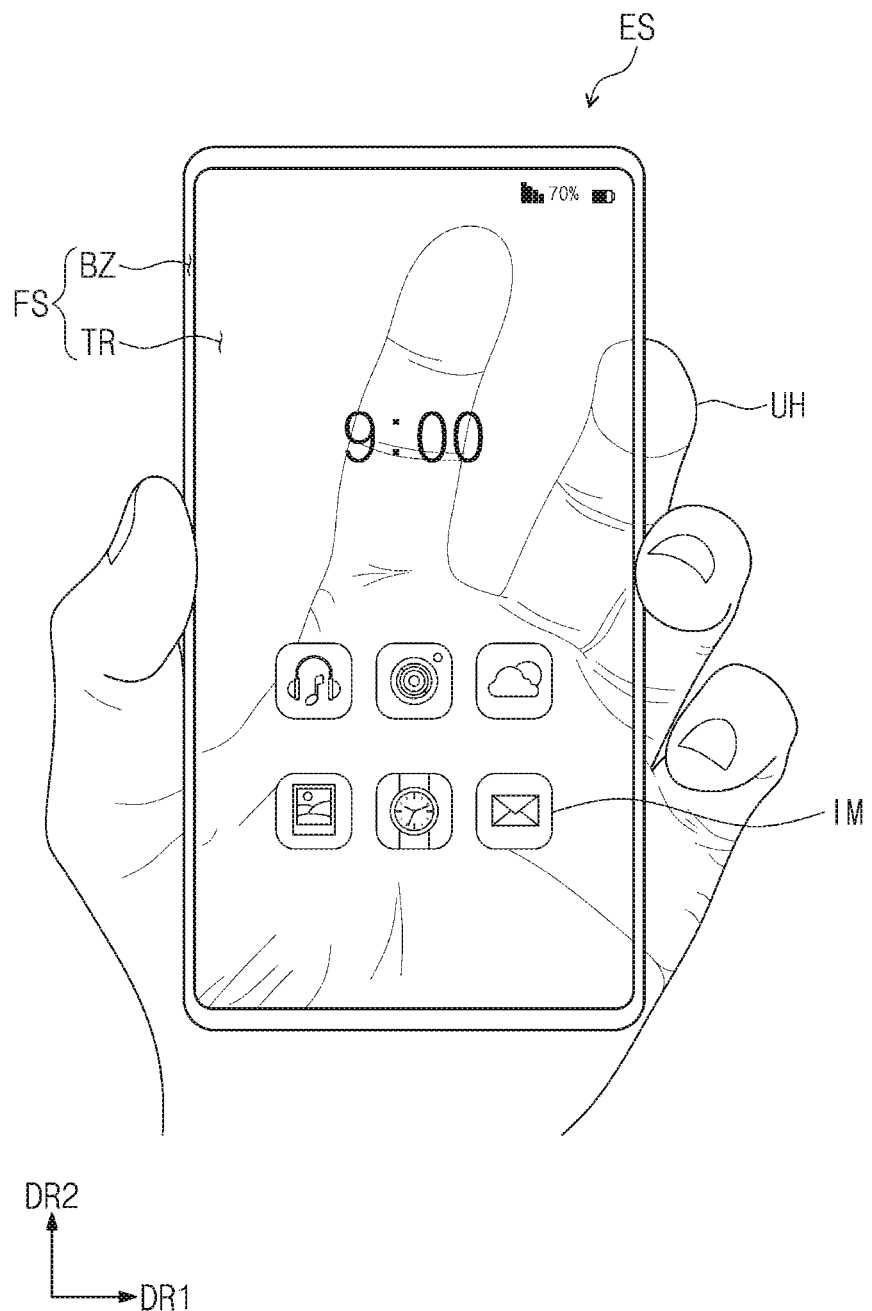
FIG. 1 is a front view of an electronic apparatus according to an embodiment.

The inventive concept may have various modifications and may be embodied in different forms, and example embodiments will be explained in detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

It will be understood that when an element (or region, layer, part, etc.) is referred to as being "on", "connected to" or "coupled to" another element, it can be directly on, connected or coupled to the other element or a third intervening elements may be present.

Meanwhile, the term "directly disposed" in the present disclosure may mean no additional layer, film, region, plate, etc. is present between a part such as a layer, a film, a region, a plate, etc. and another part. For example, when an element is referred to as being "directly disposed", two layers or two units are disposed without using an additional unit such as an adhesive unit therebetween.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, a display panel and a display apparatus including the same according to an embodiment of the inventive concept will be explained with reference to the accompanying drawings.

Figure 2:
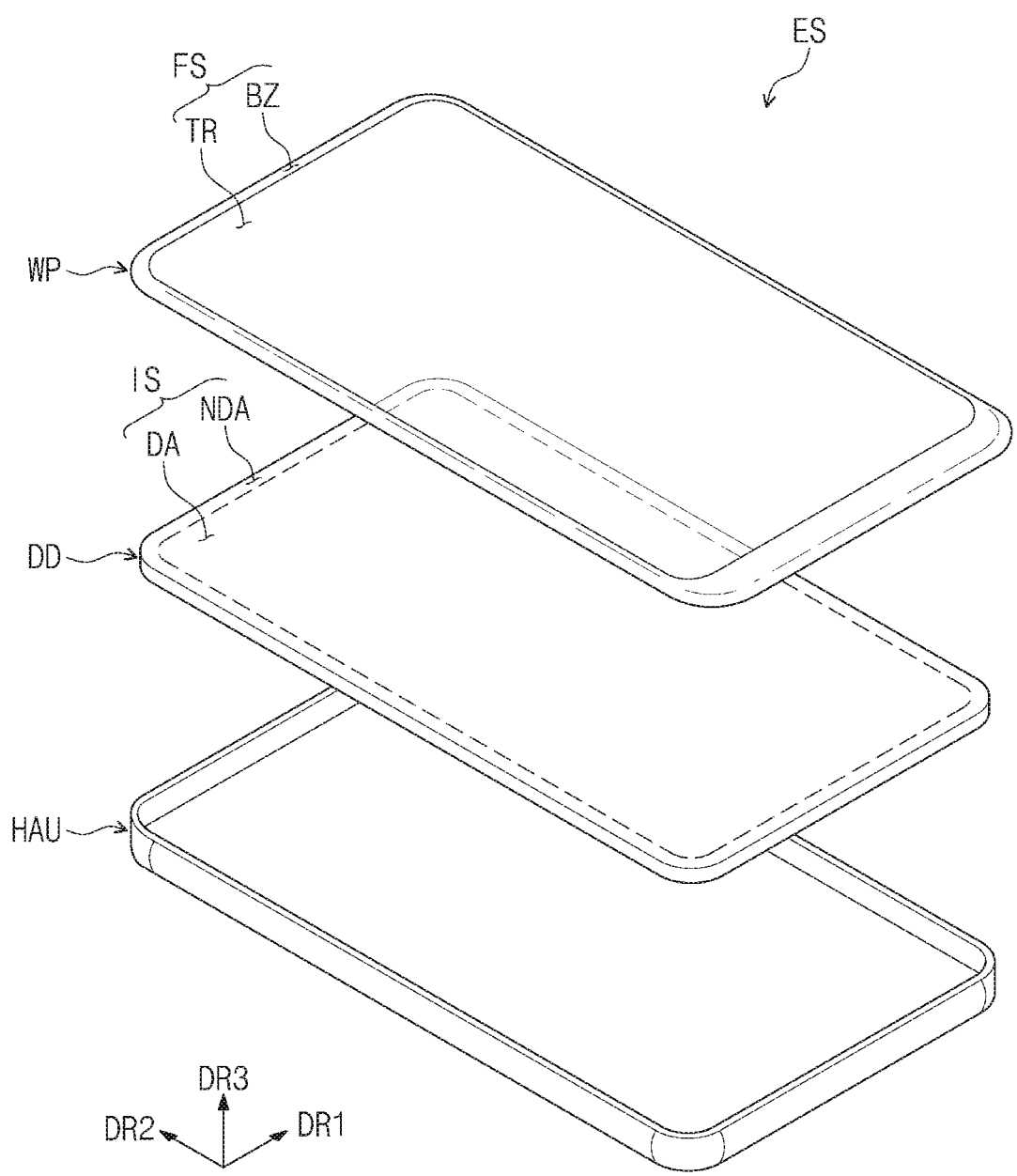
FIG. 2 is a perspective view of an electronic apparatus of an embodiment.
Figure 3:
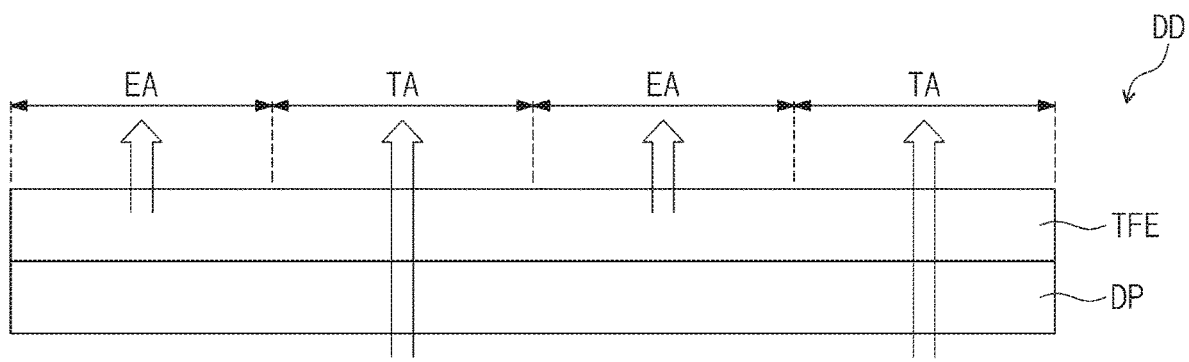
FIG. 3 is a schematic cross-sectional view of a display apparatus.
Figure 4A:
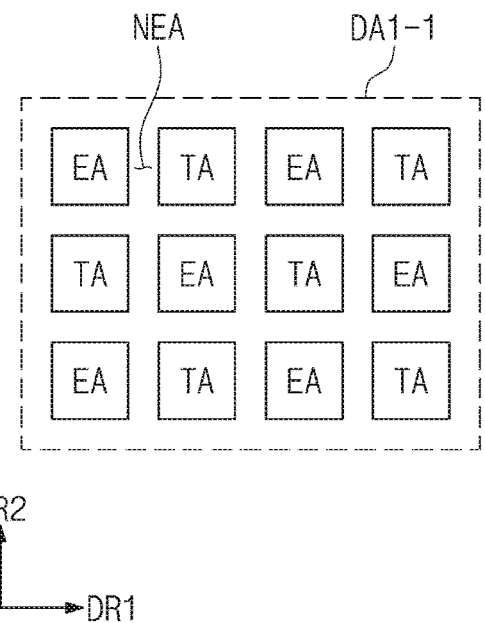
FIG. 4A and FIG. 4B are plan views showing portions of a display apparatus according to an embodiment.
Figure 4B:
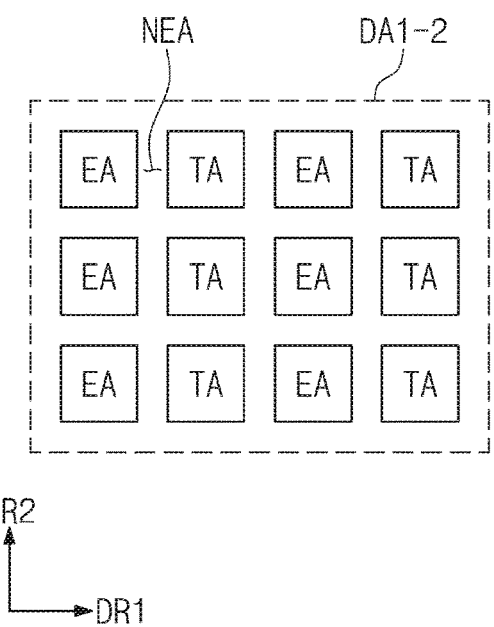

FIG. 1 is a front view showing an embodiment of an electronic apparatus ES. FIG. 2 is an exploded perspective view of an electronic apparatus ES of an embodiment. FIG. 3 is a schematic cross-sectional view showing a display apparatus DD. FIG. 4A and FIG. 4B are plan views showing portions of a display apparatus DD according to an embodiment. FIG. 4A and FIG. 4B are plan views showing display areas DA1-1 and DA1-2.

In an embodiment, an electronic apparatus ES may be a large-sized electronic device such as a television, a monitor, and an external advertising board. In addition, the electronic apparatus ES may be a small and medium-sized electronic device such as a personal computer, a notebook computer, a personal digital terminal, a car navigation unit, a game console, a smart phone, a tablet, and a camera. In addition, these are suggested only for illustration, and other electronic apparatuses may be employed as long as they are not deviated from the inventive concept. In this embodiment, a smart phone is illustrated as an embodiment of the electronic apparatus ES.

In the electronic apparatus ES, a user may recognize images IM displayed on a display surface IS and also recognize objects or images disposed on the rear side of the electronic apparatus ES. In FIG. 1, as an embodiment of the present disclosure, a user's hand UH disposed on the rear side of the electronic apparatus ES is shown. Meanwhile, the electronic apparatus ES may be a transparent display device but is not limited thereto. Only a partial area of the electronic apparatus ES may be transparent.

In the electronic apparatus ES, the display surface IS may correspond to the front surface of the display apparatus DD. The image IM may include a still image as well as a dynamic image. In FIG. 1, the display surface IS is a surface of the display apparatus DD that extends parallel to a plane defined by a first direction DR1 and a second direction DR2 crossing the first direction DR1. However, this is an embodiment, and in another embodiment, the display surface IS of the electronic apparatus ES may have a bent shape.

Meanwhile, though not shown in the drawings, the electronic apparatus ES may include a foldable display apparatus including a folding area and a non-folding area, or a bending display apparatus including at least one bending part.

The electronic apparatus ES may include a display apparatus DD and a housing HAU. The display apparatus DD may display an image IM through a display surface IS. Among the normal directions of the display surface IS, that is, the thickness direction of the display apparatus DD, a direction displaying the image IM is indicated by a third direction DR3. The front surface (or top surface) and rear surface (or bottom surface) of each member may be defined along the third direction DR3. Meanwhile, the directions indicated by the first to third directions DR1, DR2 and DR3 have relative concept and may be changed to other directions.

The housing HAU may receive the display apparatus DD. The housing HAU may be disposed to cover side surfaces and a bottom surface of the display apparatus DD so that the display surface IS of the display apparatus DD is exposed to outside. The housing HAU covers the side surfaces and the bottom surface of the display apparatus DD and may expose the entire top surface of the display apparatus DD. However, an embodiment of the inventive concept is not limited thereto, and the housing HAU may cover a portion of the top surface as well as the side surfaces and the bottom surface of the display apparatus DD.

In the electronic apparatus ES of an embodiment, the window WP may include an optically transparent insulating material. The window WP may include a transmission area TR and a bezel area BZ. The front surface FS of the window WP including the transmission area TR and the bezel area BZ corresponds to the front surface FS of the electronic apparatus ES. A user may see images provided through the transmission area TR of the front surface FS of the electronic apparatus ES.

In FIG. 1 and FIG. 2, the transmission area TR is shown in a square shape of which corners are rounded. However, this shape is only an embodiment, and the transmission area TR may have various shapes and is not limited to the embodiment. The transmission area TR may be an optically transparent area. The bezel area BZ may be an area having a relatively lower transmission ratio when compared with the transmission area TR. The bezel area BZ may have a certain color. The bezel area BZ is disposed adjacent to the transmission area TR and may completely surround the transmission area TR. The bezel area BZ may define the shape of the transmission area TR. However, an embodiment of the inventive concept is not limited thereto, and the bezel area BZ may be disposed adjacent to only one side of the transmission area TR, or a portion thereof may be omitted.

The display apparatus DD may be disposed below the window WP. In this disclosure, the term "below" may mean an opposite direction to a direction providing images by the display apparatus DD.

In an embodiment, the display apparatus DD may display images IM. In the display apparatus DD, the images IM are displayed on the display surface IS. The display apparatus DD includes a display area DA and a non-display area NDA. The display area DA of the display apparatus DD may be an area displaying images IM therethrough. The display area DA of the display apparatus DD may be transparent, thus objects or images disposed on the rear side of the display apparatus DD may be seen from the front side of the display apparatus DD. The non-display area NDA may be an area covered by the bezel area BZ. The non-display area NDA is disposed adjacent to the display area DA. The non-display area NDA may completely surround the display area DA. In the non-display area NDA, objects or images disposed on the rear side of the display apparatus DD may not be seen from the front side of the display apparatus DD.

Referring to FIG. 3, the display apparatus DD may include a display panel DP and an encapsulation layer TFE. The display panel DP may include an emission layer emitting light. The emission layer is provided to correspond to a light-emitting area EA. The display panel DP may transmit external light through a light-transmitting area TA. Accordingly, the display panel DP may allow the recognition of objects or external images disposed on the rear side of the display apparatus DD through the light-transmitting area TA while displaying images through the light-emitting area EA. However, if the transmittance of the light-transmitting area TA is low, the external light transmittance of the display panel DP may be reduced, and the external images may not be recognized clearly.

In FIG. 3, a structure in which the light-transmitting area TA is provided directly adjacent to the light-emitting area EA, but a non-light-emitting area may be further provided between the light-emitting area EA and the light-transmitting area TA.

Referring to FIG. 4A, a display area DA1-1 of an embodiment may include multiple light-emitting areas EA, non-light-emitting areas NEA and light-transmitting areas TA. The display area DA including the light-transmitting area TA may be defined as the first display area DA1-1. At least one pixel may be disposed in the light-emitting area EA, and a deficient pixel may be disposed in the light-transmitting area TA. In the present disclosure, the deficient pixel means a pixel from which an emission layer and a second electrode are omitted from the one pixel. Accordingly, if the pixel provides images in the light-emitting area EA, the deficient pixel in the light-transmitting area TA may not provide images.

The light-emitting areas EA and the light-transmitting areas TA may be arranged with a certain configuration. FIG. 4A and FIG. 4B shows the arrangement structure of the light-emitting areas EA, and the light-transmitting areas TA in the first and second display areas DA1-1 and DA1-2 as embodiments.

Referring to FIG. 4A, the light-emitting areas EA and the light-transmitting areas TA may be alternately arranged in the first direction DR1 and the second direction DR2. For example, one light-emitting area EA and one light-transmitting area TA may be alternately arranged.

Referring to FIG. 4B, a first column and a second column may be alternately arranged along the first direction DR1. The first column may be a column in which the light-emitting areas EA are arranged along the second direction DR2. The second column may be a column in which the light-transmitting areas TA are arranged along the second direction DR2.

However, the arrangement structure of the light-emitting areas EA and the light-transmitting areas TA is not limited thereto and may be diversely changed only if a structure includes multiple light-emitting areas EA and light-transmitting areas TA. In FIG. 4A and FIG. 4B, the numbers of the light-emitting areas EA and the light-transmitting areas TA are the same but may be different from each other. In addition, the areas of one light-emitting area EA and one light-transmitting area TA are shown the same, but the sizes may be different from each other. The number and size of the light-transmitting areas TA may be changed according to the desired transmittance of the display apparatus DD. In addition, the partial area of the display apparatus may not include the light-transmitting area TA.

FIG. 5A to FIG. 5D are enlarged plan views of the light-emitting areas of FIG. 4A and FIG. 4B. FIG. 5A to FIG. 5D are plan views showing pixel areas disposed in the light-emitting areas EA.

At least one pixel may be disposed in the light-emitting area EA. A pixel area may be defined in the pixel. The pixel area is an area providing certain light and may be an area defined by a pixel defining layer PDL (see FIG. 6A), which will be explained later.

Figure 5A:
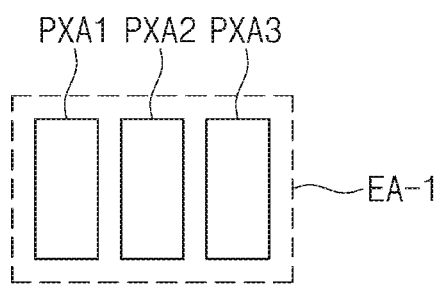
FIG. 5A, 5B, 5C and FIG. 5D are enlarged plan views of partial areas of FIG. 4A.

Referring to FIG. 5A, the light-emitting area EA-1 may include a first pixel area PXA1, a second pixel area PXA2, and a third pixel area PXA3. Each of the first pixel area PXA1, the second pixel area PXA2, and the third pixel area PXA3 may have a rectangular shape. Each of the first to third pixel areas PXA1, PXA2 and PXA3 may have a long side along a vertical direction.

The multiple pixels may include a red pixel producing red light, a green pixel producing green light, and a blue pixel producing blue light, respectively. In this embodiment, the first pixel area PXA1 may be the red pixel area, the second pixel area PXA2 may be the green pixel area, and the third pixel area PXA3 may be the blue pixel area.

The first pixel area PXA1, the second pixel area PXA2, and the third pixel area PXA3 may be arranged along a certain direction. The areas of the first pixel area PXA1, the second pixel area PXA2, and the third pixel area PXA3 may be the same or different from each other.

Figure 5B:
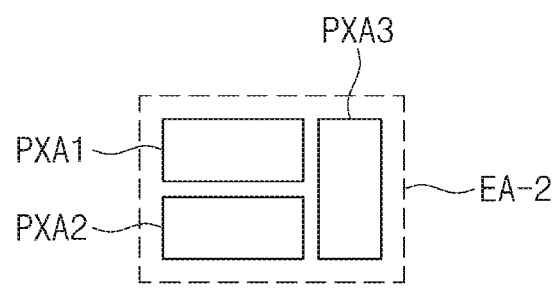

Referring to FIG. 5B, the first pixel area PXA1 and the second pixel area PXA2 may have a long side along a horizontal direction, and the third pixel area PXA3 may have a long side along the vertical direction.

Each of FIG. 5A and FIG. 5B shows cases where one of the light-emitting areas EA-1 and EA-2 includes three pixel areas as embodiments, but an embodiment of the inventive concept is not limited thereto. For example, one of the light-emitting areas EA-1 and EA-2 may include one pixel area, two pixel areas, or four or more pixel areas.

Figure 5C:
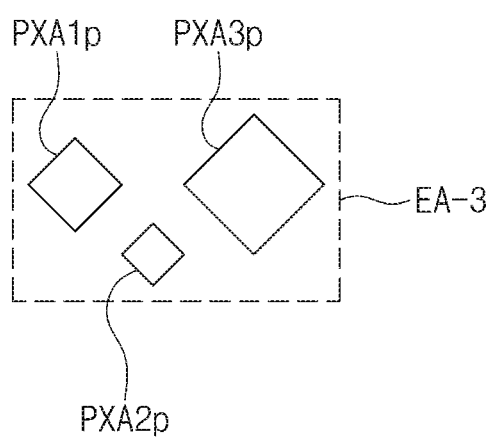

Referring to FIG. 5C, the light-emitting area EA-3 may include a first pixel area PXA1$p$, a second pixel area PXA2$p$, and a third pixel area PXA3$p$. Each of the first pixel area PXA1$p$, the second pixel area PXA2$p$, and the third pixel area PXA3$p$ may have a rhombus shape. The first pixel area PXA1$p$, the second pixel area PXA2$p$, and the third pixel area PXA3$p$ may have different areas. The first pixel area PXA1$p$ may have a first area, the second pixel area PXA2$p$ may have a second area, and the third pixel area PXA3$p$ may have a third area. The first area may be larger than the second area, and the third area may be larger than the first area. The arrangement shape as in FIG. 5C may be referred to as a pentile shape.

Figure 5D:
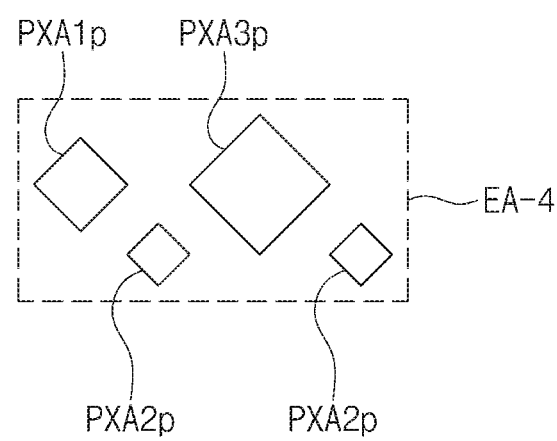

Referring to FIG. 5D, the light-emitting area EA-4 may further include one more second pixel area PXA2$p$ when compared with FIG. 5C.

Figure 6A:
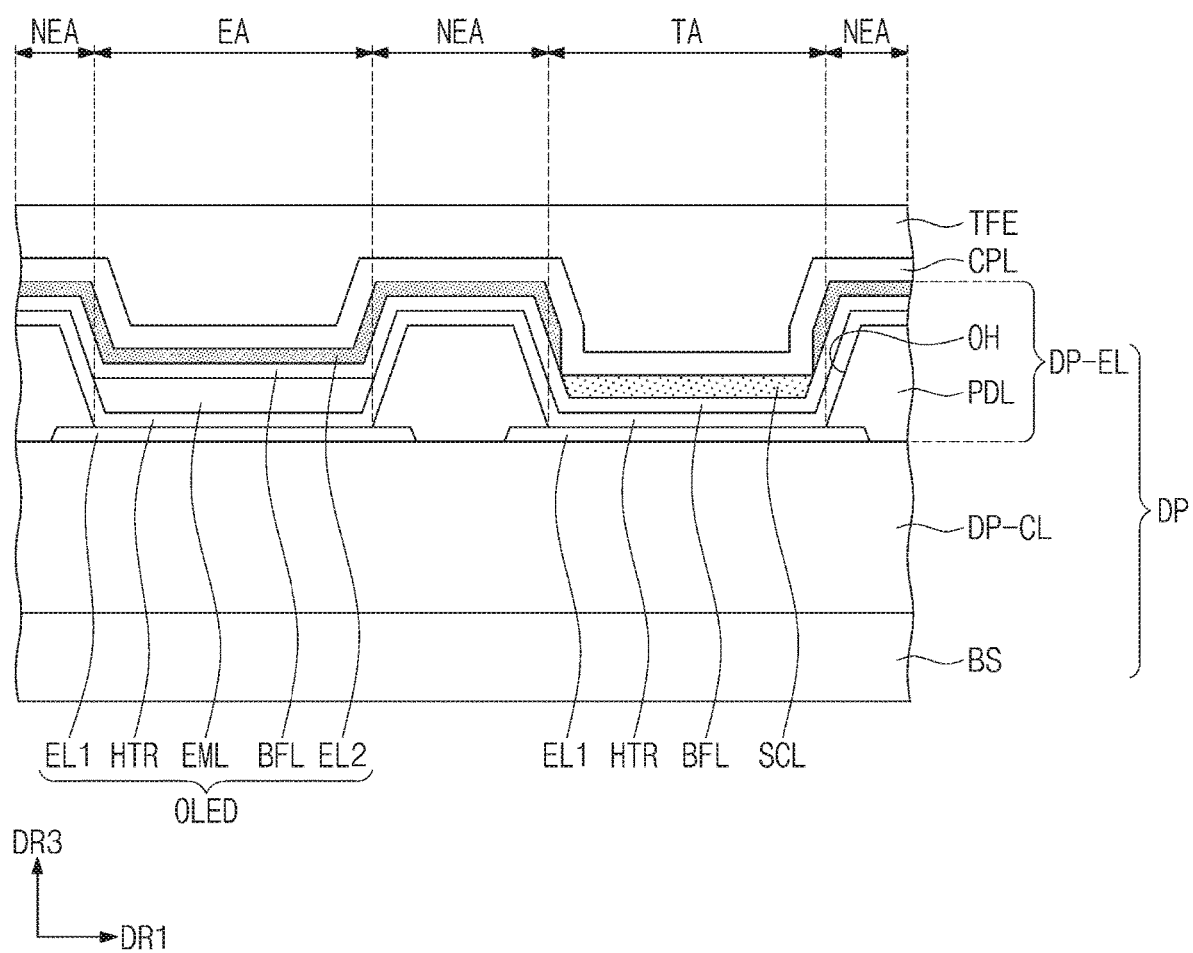
FIG. 6A is a cross-sectional view of a display apparatus of an embodiment.
Figure 6B:
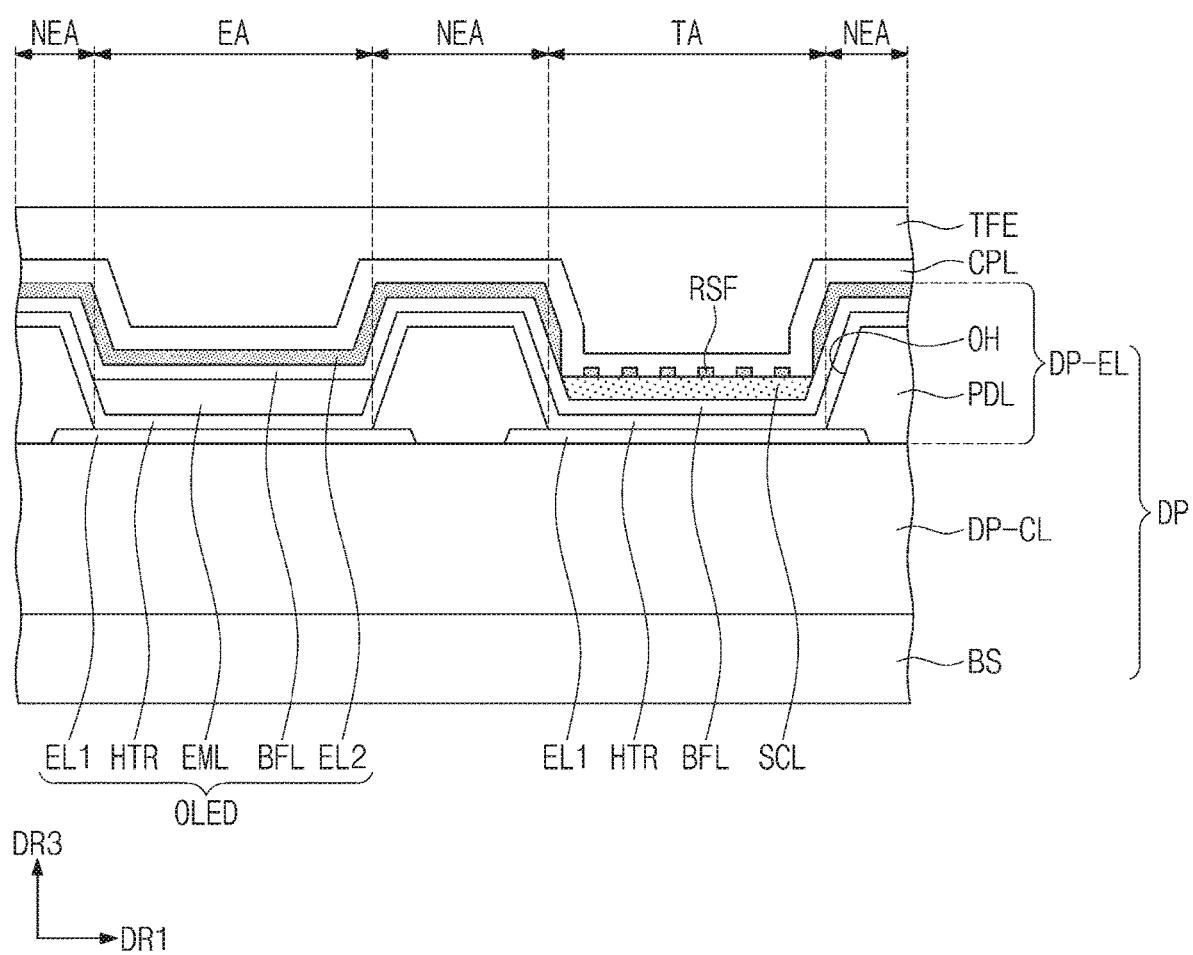
FIG. 6B is a cross-sectional view of a display apparatus of an embodiment.

FIG. 6A and FIG. 6B are cross-sectional views showing portions of display apparatuses DD of embodiments.

A display apparatus DD may include a display panel DP and an encapsulation layer TFE. The display panel DP may include a base substrate BS, a circuit layer DP-CL provided on the base substrate BS and a display device layer DP-EL.

The display apparatus DD may include two areas having different transmittance. A first area is a light-emitting area EA having relatively lower transmittance and may be an area emitting light produced in an organic light-emitting diode OLED including an emission layer EML. Each of the light-emitting areas EA may include pixel areas, for example, the first pixel area PXA1 or PXA1$p$, the second pixel area PXA2 or PXA2$p$, and the third pixel area PXA3 or PXA3$p$. Each pixel may include a pixel area. A second area is a light-transmitting area TA having relatively higher light transmittance and may correspond to a deficient pixel in which an emission layer EML is not disposed, but a surface energy controlling layer SCL is disposed. In FIG. 6A, one pixel area PXA1$p$ (FIG. 5C) among the pixel areas and one light transmitting area are shown.

In the display apparatus DD of an embodiment, the display panel DP may be a self-light-emitting type display panel. For example, the display panel DP may be an organic electroluminescence display panel including an organic light-emitting diode OLED. However, an embodiment of the inventive concept is not limited thereto, and the display panel DP may be a quantum dot light-emitting display panel including a quantum dot light-emitting device. The emission layer EML may include an organic light-emitting material. However, an embodiment of the inventive concept is not limited thereto, and a quantum dot may be included in the emission layer EML.

The light-emitting area EA and the light-transmitting area TA may be areas defined by a pixel defining layer PDL. The non-light-emitting areas NEA may be areas between neighboring light-emitting areas EA and light-transmitting areas TA, or though not shown, areas between neighboring light-emitting areas, corresponding to the pixel defining layer PDL. The emission layer EML of the organic light-emitting diode OLED may be disposed in an opening OH defined by the pixel defining layer PDL.

The pixel defining layer PDL may be formed using a polymer resin. For example, the pixel defining layer PDL may include a polyacrylate-based resin or a polyimide-based resin. In addition, the pixel defining layer PDL may further include an inorganic material in addition to the polymer resin. Meanwhile, the pixel defining layer PDL may include a light-absorbing material that includes a black pigment or a black dye. The pixel defining layer PDL including a black pigment or a black dye may be a black pixel defining layer. During forming the pixel defining layer PDL, carbon black, etc. may be used as the black pigment or black dye, but an embodiment of the inventive concept is not limited thereto.

In addition, the pixel defining layer PDL may be formed using an inorganic material. For example, the pixel defining layer PDL may be formed by silicon nitride ($SiN_x$), silicon oxide ($SiO_x$), silicon oxynitride ($SiO_xN_y$), etc.

The base substrate BS may be a base surface on which the display device layer DP-EL is disposed. The base substrate BS may be a glass substrate, a metal substrate, a plastic substrate, etc. However, an embodiment of the inventive concept is not limited thereto, and the base substrate BS may be an inorganic layer, an organic layer, or a composite material layer. The base substrate BS may be a flexible substrate which may be easily bent or folded.

In an embodiment, the circuit layer DP-CL may be disposed on the base substrate BS, and the circuit layer DP-CL may include multiple transistors (not shown). The transistors (not shown) each may include a control electrode, an input electrode, and an output electrode. For example, the circuit layer DP-CL may include a switching transistor and a driving transistor for driving the organic light-emitting diode OLED of the display device layer DP-EL.

The organic light-emitting diode OLED according to an embodiment may include a first electrode EL1, a second electrode EL2 which opposes the first electrode EL1, multiple functional layers disposed between the first electrode EL1 and the second electrode EL2, and an emission layer EML disposed between the first electrode EL1 and the second electrode EL2.

The multiple functional layers may include a hole transport region HTR disposed between the first electrode EL1 and the emission layer EML, and a buffer layer BFL disposed between the emission layer EML and the second electrode EL2.

The first electrode EL1 has conductivity. The first electrode EL1 may be formed using a metal alloy or a conductive compound. The first electrode EL1 may be an anode. The first electrode EL1 may be a pixel electrode.

The first electrode EL1 according to an embodiment may be a reflective electrode. However, an embodiment of the inventive concept is not limited thereto. For example, the first electrode EL1 may be a transmissive electrode, or a transflective electrode. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, compounds thereof, or mixtures thereof (for example, a mixture of Ag and Mg). Alternatively, the first electrode EL1 may have a multilayered structure including a reflective layer or a transflective layer formed using the above-described materials, and a transparent conductive layer formed using indium tin oxide (ITO), indium zinc oxide (IZO), zinc oxide (ZnO), indium tin zinc oxide (ITZO), etc. For example, the first electrode EL1 may be a multilayered metal layer and may have a stacked structure of metal layers of ITO/Ag/ITO.

The hole transport region HTR is disposed on the first electrode ELL The hole transport region HTR may include a hole injection layer HIL, a hole transport layer HTL, etc. In addition, the hole transport region HTR may further include at least one of a hole buffer layer or an electron blocking layer in addition to the hole injection layer HIL and the hole transport layer HTL. The hole buffer layer may compensate an optical resonance distance according to the wavelength of light emitted from the emission layer EML and may increase light emission efficiency. Materials which may be included in the hole transport region HTR may be used as materials included in the hole buffer layer (not shown). The electron blocking layer (not shown) is a layer playing the role of blocking the electron injection from the electron transport region ETR to the hole transport region HTR.

The hole transport region HTR may have a single layer formed using a single material, a single layer formed using a plurality of different materials, or a multilayer structure including a plurality of layers formed using a plurality of different materials. For example, the hole transport region HTR may have a structure of a single layer formed using a plurality of different materials or a structure stacked from the first electrode EL1 of hole injection layer/hole transport layer, hole injection layer/hole transport layer/hole buffer layer, hole injection layer/hole buffer layer, hole transport layer/hole buffer layer, hole injection layer/hole transport layer/electron blocking layer, etc. However, an embodiment of the inventive concept is not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-tris(N,N-diphenylamino)triphenylamine (TDATA), 4,4',4''-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DB SA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, and dipyrazino[2,3-f: 2',3'-h] quinoxaline-2,3,6,7,10,11-hexacarbonitrile (HAT-CN).

The hole transport layer may include, for example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The emission layer EML is provided on the hole transport region HTR and disposed overlapping the light-emitting area EA. The emission layer EML may include an organic light-emitting material as described above. For example, the emission layer EML may be composed of at least one material among materials emitting red, green, or blue, and may include a fluorescence material or a phosphorescence material. However, an embodiment of the inventive concept is not limited thereto, and a quantum dot may be included.

The emission layer EML may be formed by using various methods such as a vacuum deposition method, a spin coating method, a cast method, a Langmuir-Blodgett (LB) method, an inkjet printing method, a laser printing method, and a laser induced thermal imaging (LITI) method.

The buffer layer BFL is provided on the emission layer EML and may protect the emission layer EML. In addition, the buffer layer BFL may further include an electron transport material that transports an electron. The thickness of the buffer layer BFL may be from about 1 Å to about 1,000 Å, or from about 10 Å to about 500 Å.

The buffer layer BFL may include an inorganic material and/or organic material. The inorganic material may be, for example, a metal material such as Be, Mg, Ca, Sr, Ba, Ra, La, Ce, Pr, Nd, Pm, Sm, Eu, Gd, Tb, Dy, Ho, Er, Tm, Yb, Lu, Li and Al, compounds thereof, mixtures thereof (for example, a mixture of Ca and Al), or a metal oxide such as $CuO_x$, $MoO_x$, $WO_x$, ZnO, $TiO_2$, $SnO_2$, $V_2O_x$, and NiO. The organic material may be, for example, a hole blocking material with a low molecular weight such as BAlq, BCP, DTBT, TPBi, PBD, TAZ, and C60F4 or a hole transport material such as BND, t-Bu-PBD, t-Bu-PND, OXD-7, OXD-star, Alq3, Bphen, and NTAZ.

The organic light-emitting diode OLED may further include an electron transport region ETR provided on the emission layer EML. The electron transport region ETR may include at least one of a hole blocking layer, an electron transport layer, or an electron injection layer, but an embodiment of the inventive concept is not limited thereto. The electron transport region ETR may have a single layer formed of a single material, a single layer formed of multiple different materials or a multilayer structure having multiple layers composed of multiple different materials.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL (FIG. 7A), the electron transport layer ETL (FIG. 7A) may include an anthracene-based compound.

However an embodiment of the inventive concept is not limited thereto, and the electron transport layer ETL (FIG. 7A) may include, for example, tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene yl)anthracene (ADN), or mixtures thereof. Otherwise, the electron transport layer may include a metal oxide such as ZnO. The thickness of the electron transport layer ETL (FIG. 7A) may be from about 100 Å to about 1,000 Å and may be, for example, from about 150 Å to about 500 Å. If the thickness of the electron transport layer ETL (FIG. 7A) satisfies the above-described range, satisfactory electron transport properties may be obtained without substantial increase of a driving voltage.

If the electron transport region ETR includes the electron injection layer EIL (FIG. 7A), the electron injection layer EIL (FIG. 7A) may include a metal halide, a metal oxide, a metal in lanthanides, or a co-deposited material of the metal halide and the metal in lanthanides. Meanwhile, the metal halide may be an alkali metal halide. For example, the electron injection layer EIL (FIG. 7A) may include LiF, lithium quinolate (Liq), $Li_2O$, BaO, NaCl, CsF, Yb, RbCl, RbI, KI, CuI or KI:Yb. However, an embodiment of the inventive concept is not limited thereto. The electron injection layer may also be formed using a mixture material of an electron transport material and an insulating organo metal salt. For example, the organo metal salt may include metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage. The electron transport region may include a hole blocking layer. The hole blocking layer may include, for example, at least one of 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 is provided on the buffer layer BFL. The second electrode EL2 may be a common electrode or a cathode. The second electrode EL2 may be a transmissive electrode, a transflective electrode or a reflective electrode. If the second electrode EL2 is the transmissive electrode, the second electrode EL2 may be formed using a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, compounds thereof, or mixtures thereof (for example, a mixture of Ag and Mg). Alternatively, the second electrode EL2 may have a multilayered structure including a reflective layer or a transflective layer formed using the above-described materials, and a transparent conductive layer formed using ITO, IZO, ZnO, ITZO, etc.

The thickness of the second electrode EL2 may be from about 50 Å to about 1,000 Å, for example, from about 100 Å to about 500 Å. In the present disclosure, the second electrode EL2 means a layer formed as one layer having a certain thickness, and in the display apparatus DD according to the present disclosure, the second electrode may be exclusively disposed in a light-emitting area EA only. If a metal included in the second electrode EL2 is disposed in a light-transmitting area TA, the transmittance of the light-transmitting area TA may be reduced due to the metal included in the second electrode. Accordingly, the display apparatus DD according to an embodiment includes a surface energy controlling layer SCL in the light-transmitting area TA on the buffer layer to prevent the second electrode EL2 from being formed on the surface energy controlling layer SCL, thus the display apparatus DD according to an embodiment may prevent or minimize the reduction of the transmittance in the light-transmitting area TA.

On the second electrode EL2, an encapsulation layer TFE is disposed. The encapsulation layer TFE may directly cover the second electrode EL2. In another embodiment of the present disclosure, a capping layer CPL may be further disposed between the encapsulation layer TFE and the second electrode EL2. In this case, the encapsulation layer TFE may directly cover the capping layer CPL. The capping layer CPL may include an organic material. For example, the capping layer CPL may include α-NPD, NPB, TPD, m-MTDATA, Alq3, CuPc, N4,N4,N4',N4'-tetra (biphenyl-4-yl) biphenyl-4,4'-diamine (TPD15), 4,4',4"-tris (carbazol-9-yl) triphenylamine (TCTA), N,N'-bis (naphthalen-1-yl), etc. The capping layer CPL may protect the second electrode EL2 from a subsequent process, for example, a sputtering process and improve light emitting efficiency of a light-emitting diode OLED.

The encapsulation layer TFE may include an organic layer and an inorganic layer. The inorganic layer may protect the light-emitting diode OLED from humidity and oxygen, and the organic layer may protect the light-emitting diode OLED from foreign materials such as dust particles. However, an embodiment of the inventive concept is not limited thereto, and in an embodiment, the encapsulation layer TFE may include a glass substrate or a plastic substrate. If the encapsulation layer TFE includes a glass substrate or a plastic substrate, an internal space may be formed between the display panel DP and the encapsulation layer TFE. The internal space may be a vacuum state. However, an embodiment of the inventive concept is not limited thereto, and the internal space may be filled with nitrogen (N2) or an insulation material.

In the light-transmitting area TA, a deficient pixel may be disposed. The deficient pixel may mean a pixel from which an emission layer EML and a second electrode EL2 are omitted, and a surface energy controlling layer SCL is included.

The surface energy controlling layer SCL exclusively overlaps the light-transmitting area TA only and is provided on the buffer layer BFL. The surface energy controlling layer SCL may have lower surface energy than the second electrode EL2 and may prevent or reduce the deposition of a metal which forms the second electrode EL2 in the light-transmitting area TA on the surface energy controlling layer SCL during forming the second electrode EL2. Accordingly, the second electrode EL2 may be prevented from being formed on a specific area, for example, the light-transmitting area TA even without performing a separate patterning process, and the high transmittance of the light-transmitting area TA may be secured.

The surface energy controlling layer SCL may include a fluorinated organic compound. The kind of the fluorinated organic compound is not limited as long as it is an organic compound including fluorine, for example, the surface energy controlling layer SCL may include perfluoride-based/high fluoride-based monomer or oligomer such as perfluorooctyl-trichlorosilane (FTOS). The fluorinated organic compound may include, for example, a trifluoromethyl group at its terminal. The ratio of a fluorine element with respect to total elements of the surface energy controlling layer SCL may be about equal to 10% or more. If the fluorine element is included in an amount greater than the range, sufficiently lower surface energy than the second electrode EL2 may be achieved. The ratio of the fluorine element with respect to total elements of the surface energy controlling layer SCL may be about 70% or less.

The concentration of fluorine in the surface controlling layer SCL may increase from the inner part to the surface thereof. The inner part of the surface energy controlling layer SCL means a portion disposed close to the hole transport region HTR or the buffer layer BFL and the surface of the surface energy controlling layer SCL means a portion disposed away from the hole transport region HTR or the buffer layer BFL.

In the light-transmitting area TA, a capping layer CPL and an encapsulation layer TFE may be disposed like in the light-emitting area EA. The capping layer CPL and the encapsulation layer TFE may cover the surface energy controlling layer SCL. Referring to FIG. 6B, the display panel DP of an embodiment may further include a residual layer RSF. The residual layer RSF is disposed on the surface energy controlling layer SCL in the light-transmitting area TA, and the capping layer CPL may cover the residual layer RSF.

The residual layer RSF may include the same material as the second electrode EL2. However, the residual layer RSF may be formed on partial portions of the surface energy controlling layer SCL or have a relatively extremely thin thickness when compared with the second electrode EL2 formed in the light-emitting area EA. For example, the thickness of the residual layer RSF may be about 1 Å or less. The shape of the residual layer RSF is not specifically limited and may be formed of, for example, multiple circles which are separated one another in a plan view. Accordingly, the residual layer RSF may expose at least a portion of the top surface of the surface energy controlling layer SCL. The radius of each of the multiple circles composing the residual layer RSF may be from about 5 Å to about 50 Å.

The residual layer RSF may be formed on the top surface of the surface energy controlling layer SCL when the layer-forming rate of the second electrode EL2 is fast or the layer-forming time increases. Accordingly, the residual layer RSF may be formed into an extremely thin thickness or as island shaped portions formed on the top surface of the surface energy controlling layer SCL. The volume of the residual layer RSF may be about 40% or less of the volume of the second electrode EL2.

Figure 7A:
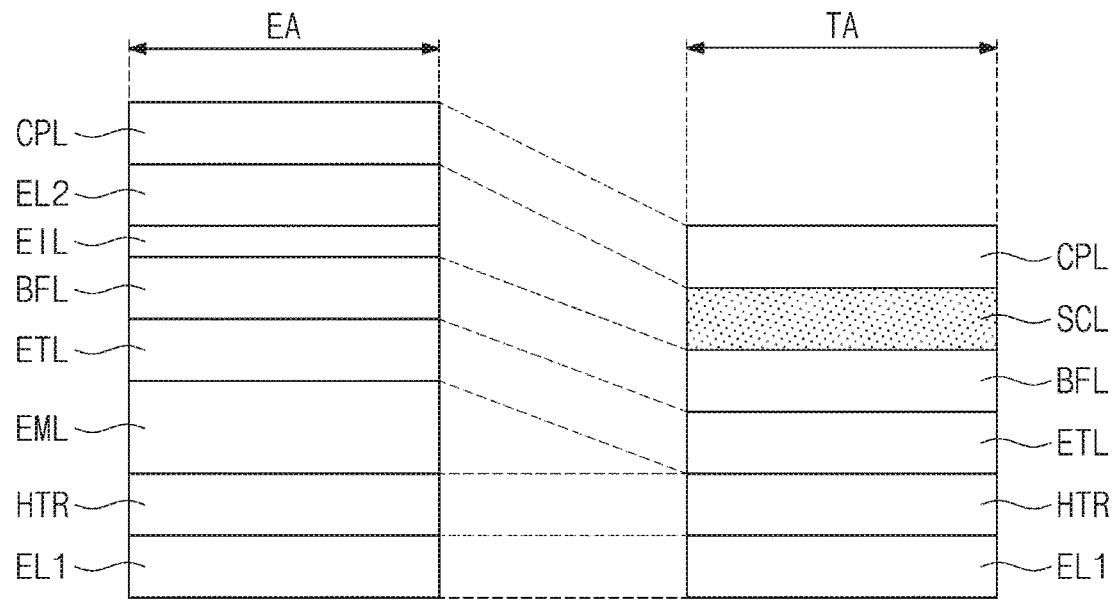
FIG. 7A, 7B and FIG. 7C are cross-sectional views of display apparatuses of embodiments.
Figure 7B:
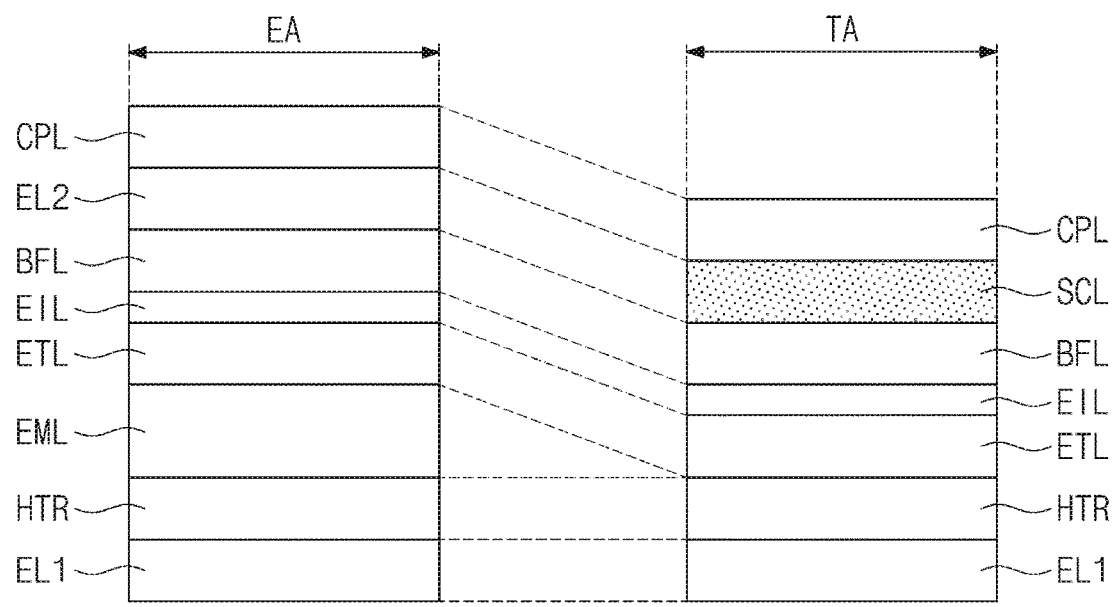
Figure 7C:
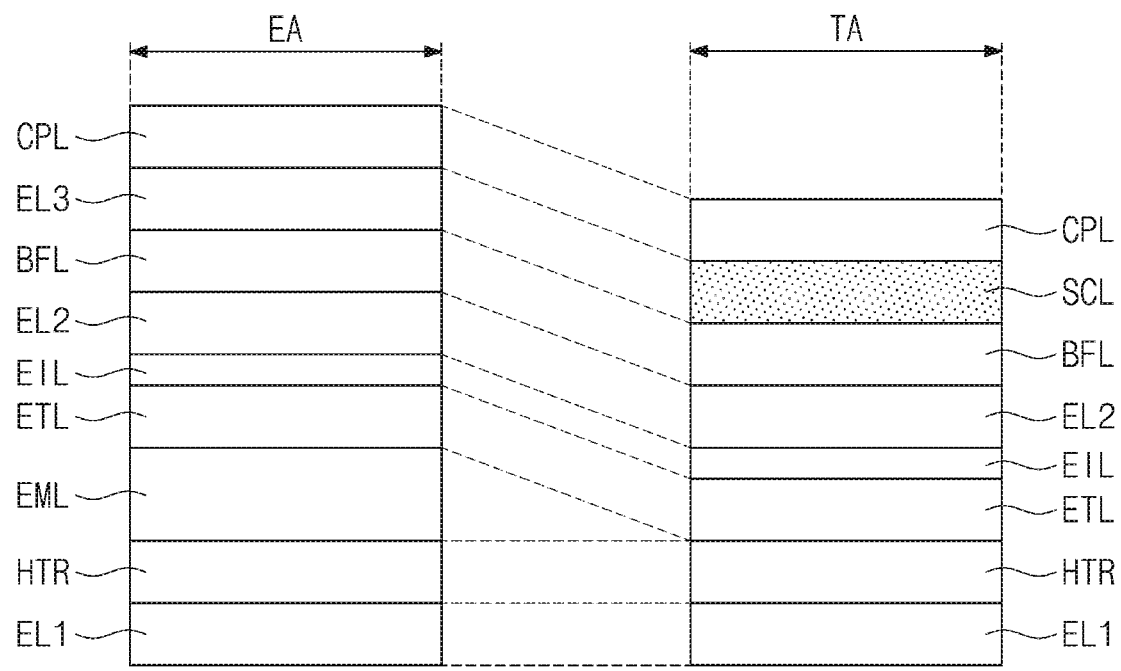

FIG. 7A to FIG. 7C are cross-sectional views of display apparatuses of embodiments. In FIG. 7A to FIG. 7C, layers forming a light-emitting area EA and a light-transmitting area TA are shown briefly. Hereinafter, the inventive concept will be explained referring to FIG. 7A to FIG. 7C. Meanwhile, the same reference symbols will be given for the same configurations as FIG. 1 to FIG. 6B, and the explanation on overlapping portions will be omitted.

Referring to FIG. 7A, a display apparatus may further include an electron transport layer ETL. The electron transport layer ETL is disposed between an emission layer EML and a buffer layer BFL in a light-emitting area EA and may be disposed between a hole transport region HTR and the buffer layer BFL in a light-transmitting area TA.

Referring to FIG. 7A and FIG. 7B, the display apparatus may further include an electron injection layer EIL. The electron injection layer EIL is disposed on the buffer layer BFL and may be disposed in both the light-emitting area EA and light-transmitting area TA. In another embodiment, the electron injection layer EIL is disposed beneath the buffer layer BFL and may be exclusively disposed in the light-emitting area EA only.

Referring to FIG. 7C, the display apparatus may further include a third electrode EL3 disposed on the second electrode EL2. The third electrode EL3 may be disposed overlapping the light-emitting area EA. The third electrode EL3 may be electrically connected with the second electrode EL2. The third electrode EL3 may be a compensation electrode for compensating voltage drop (IR drop) due to the decrease of the thickness and area of the second electrode EL2. In an embodiment of this disclosure, the third electrode EL3 may have a thickness of about 50 Å to about 1,000 Å.

Figure 8:
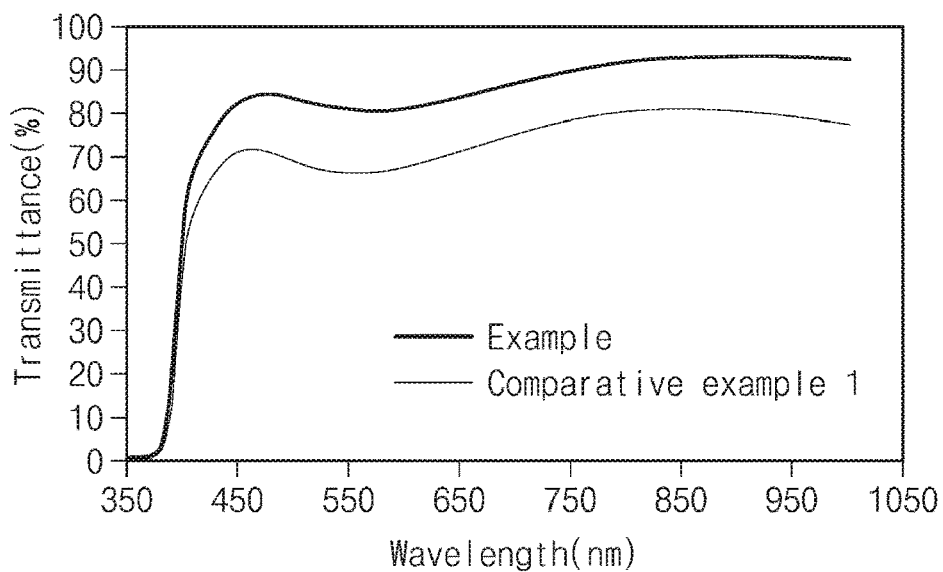
FIG. 8 is a graph showing light transmittance of display apparatuses according to the Example of the inventive concept and Comparative Example.

FIG. 8 is a graph showing light transmittance of display apparatuses according to the Comparative Example (Comparative example 1) and the Example of the inventive concept (Example). The display apparatus according to the Example includes the display panel of FIG. 6A and the display apparatus according to the Comparative Example has the same configuration as the display apparatus according to the Example except that a surface energy controlling layer is not included in the light-transmitting area TA and the second electrode EL2 is included in the light-transmitting area TA. According to the graph of FIG. 8, the transmittance of the Example is higher than that of the comparative example 1 in all wavelengths of light, and accordingly, it could be confirmed that the transmittance of the display apparatus including the surface energy controlling layer of the inventive concept may be improved.

Figure 9:
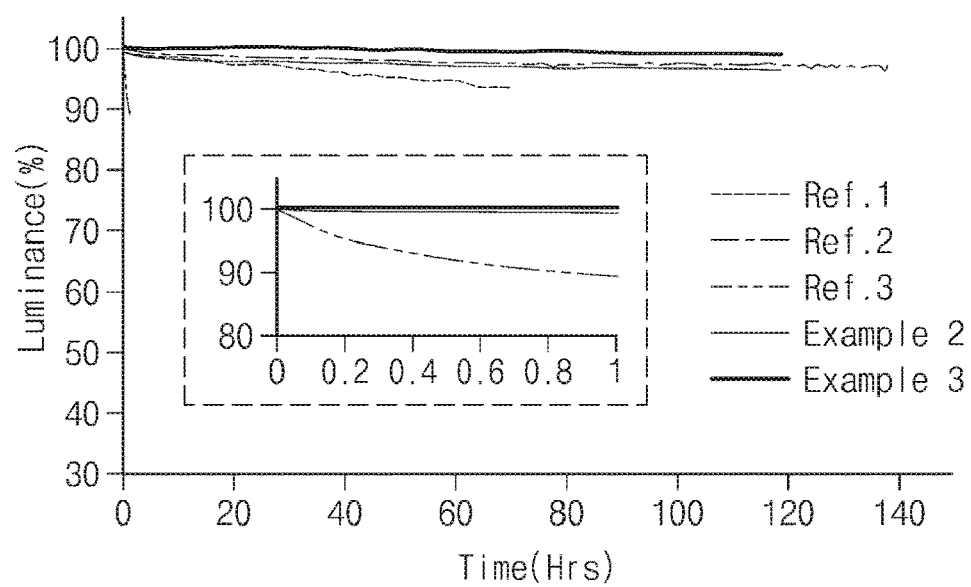
FIG. 9 is a graph showing lifetimes of display apparatuses according to the Examples of the inventive concept and Comparative Examples.

FIG. 9 is a graph showing lifetimes of display apparatuses according to the Comparative Examples (ref. 1, ref. 2 and ref. 3) and the Examples (example 2 and example 3) of the inventive concept. The configurations of Examples 2 and 3 are the same as that of the Example of FIG. 8, and Ref 1 and Ref 2 have the same configuration as that of the Example of FIG. 8 except that a surface energy controlling layer and a buffer layer are not included in the light-transmitting area TA. The configuration of Ref 3 is the same as that of the Example of FIG. 8 except that a buffer layer is not included in the light-transmitting area TA.

A small graph in FIG. 9 is an enlarged view of 0 to 1 hours. According to small graph in FIG. 9, it could be confirmed that, when a buffer layer is not included, the luminance is rapidly reduced with lapse of time, thus the lifetime of the display apparatus is reduced rapidly as lapse of time. On the contrary, it could be confirmed that the Example including a buffer layer maintains similar or higher luminance even when compared with that of the conventional display apparatus not including a surface energy controlling layer. Through this, it could be confirmed that the buffer layer may effectively prevent the influence of the surface energy controlling layer to the device properties.

As confirmed in FIG. 8 and FIG. 9, the display apparatus of the inventive concept includes a surface energy controlling layer to secure high transmittance and includes a buffer layer to prevent the decrease of the lifetime of a display apparatus.

Figure 10A:
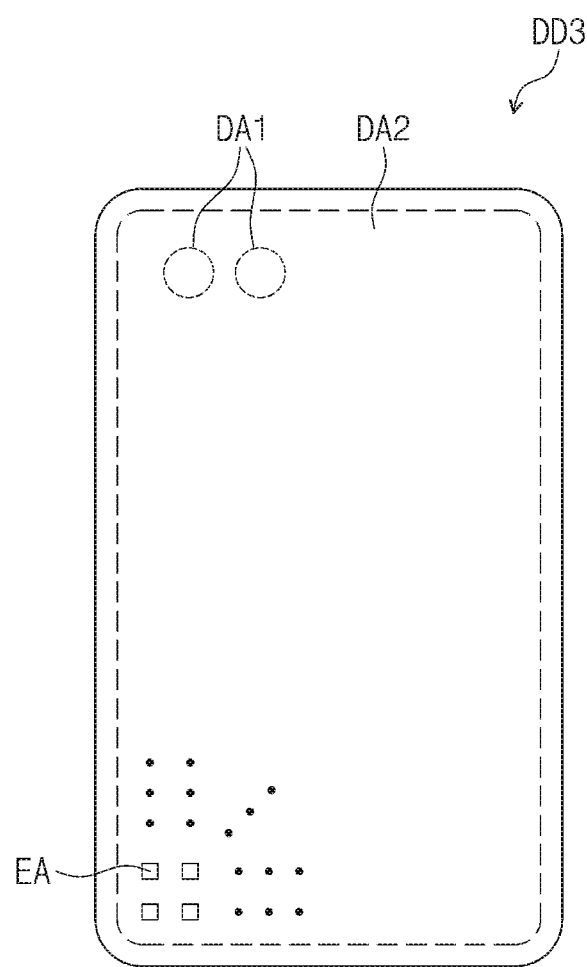
FIG. 10A and FIG. 10B are plan views of display apparatuses of embodiments.
Figure 10B:
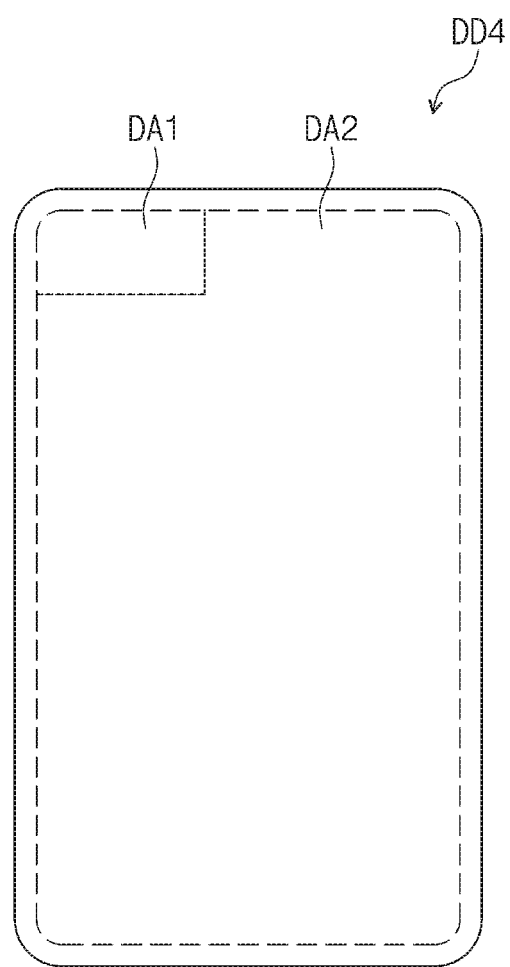

FIG. 10A and FIG. 10B are plan views of a display apparatuses DD3 and DD4 of embodiments.

Referring to FIG. 10A and FIG. 10B, the display apparatuses DD3 and DD4 of embodiments may include a first display area DA1 and a second display area DA2. The first display area DA1 may be defined as an area including a light-emitting area EA and a light-transmitting area TA. The second display area DA2 may be defined as an area not including a light-transmitting area TA. Accordingly, the first display area DA1 may have higher transmittance than the second display area DA2. In FIG. 10A, the first display area DA1 has a circle shape and is formed, for example, in separated multiple areas. However, an embodiment of the inventive concept is not limited thereto. In FIG. 10B, the first display area DA1 is defined, for example, at the left corner, but is not limited thereto. For example, in an embodiment of the inventive concept, the first display area DA1 may be defined at the right corner of the display apparatus DD4, or at both of the left corner and right corner of the display apparatus DD4.

The display panel and the display apparatus including the same of an embodiment include a layer of which surface energy is controlled and may improve the transmittance of a light-transmitting area.

The display panel and the display apparatus including the same of an embodiment include a buffer layer disposed beneath a surface energy controlling layer and may prevent the degradation of the lifetime of the display apparatus.

Although preferred embodiments of the inventive concept have been described, it is understood that various changes and modifications can be made by one ordinary skilled in the art within the spirit and technical scope of the inventive concept described in the appended claims.

Accordingly, the technical scope of the inventive concept is to be determined by the following claims and shall not be restricted or limited by the foregoing detailed description.

What is claimed is:

1. A display panel comprising a first area and a second area disposed adjacent to the first area in a plan view, the display panel comprising:
    a first electrode disposed in the first area and the second area;
    a hole transport region disposed on the first electrode to overlap the first electrode;
    an emission layer disposed on the hole transport region to overlap the first electrode in the first area and not to overlap the first electrode in the second area;
    a buffer layer disposed on the emission layer in the first area and the second area;
    a surface energy controlling layer disposed on the buffer layer to overlap the first electrode in the second area and not to overlap the first electrode in the first area; and
    a second electrode disposed on the buffer layer to overlap the first electrode in the first area and not to overlap the surface energy controlling layer.

2. The display panel of claim 1, wherein the second area has higher light transmittance than the first area.

3. The display panel of claim 1, wherein the surface energy controlling layer has lower surface energy than the second electrode.

4. The display panel of claim 1, wherein the surface energy controlling layer comprises a fluorinated organic compound.

5. The display panel of claim 4, wherein the fluorinated organic compound comprises a trifluoromethyl group at a terminal.

6. The display panel of claim 4, wherein an elemental ratio of fluorine with respect to total elements of the surface energy controlling layer is about 10% to about 70%.

7. The display panel of claim 6, wherein a concentration of the fluorine increases from an inner part of the surface energy controlling layer to a surface of the surface energy controlling layer.

8. The display panel of claim 1, further comprising an electron transport layer disposed between the emission layer and the buffer layer.

9. The display panel of claim 1, further comprising an electron injection layer directly disposed on the buffer layer to overlap the first area and not to overlap the second area.

10. The display panel of claim 1, further comprising an electron injection layer directly disposed beneath the buffer layer to overlap the first area and the second area in a plan view.

11. The display panel of claim 1, further comprising a residual layer disposed on the surface energy controlling layer,
    wherein the residual layer comprises the same material as the second electrode.

12. The display panel of claim 1, wherein the display panel comprising a plurality of first areas and a plurality of second areas, and
    wherein the plurality of first areas are disposed to be spaced apart from each other and the plurality of the second areas are disposed adjacent to the plurality of first areas, respectively.

13. The display panel of claim 1, wherein the display panel comprising a plurality of first areas and a plurality of second areas, respectively, and
    wherein a portion of the plurality of first areas is disposed adjacent to the plurality of second areas, respectively.

14. A display apparatus comprising:
    a first area and a second area disposed adjacent to the first area in a plan view;
    a pixel disposed in the first area, the pixel including an organic light-emitting diode having a first electrode, an emission layer, a buffer layer and a second electrode; and
    a deficient pixel disposed in the second area, the deficient pixel including the first electrode, the buffer layer and a surface energy controlling layer, and not including the emission layer and the second electrode.

15. The display apparatus of claim 14, wherein the surface energy controlling layer comprises a fluorinated organic compound.

16. The display apparatus of claim 15, wherein an element ratio of fluorine with respect to total elements in the surface energy controlling layer is about 10% to about 70%.

17. The display apparatus of claim 14, wherein the buffer layer comprises at least one among Be, Mg, Ca, Sr, Ba, Ra, La, Ce, Pr, Nd, Pm, Sm, Eu, Gd, Tb, Dy, Ho, Er, Tm, Yb, Lu, Li, Al, compounds thereof, mixtures thereof, $CuO_x$, $MoO_x$, $WO_x$, ZnO, $TiO_2$, $SnO_2$, $V2O_x$, and NiO.

18. The display apparatus of claim 14, further comprising an encapsulation layer encapsulating the second electrode and the surface energy controlling layer.

19. The display apparatus of claim 14, further comprising a capping layer disposed on the second electrode and the surface energy controlling layer.

* * * * *